(12) United States Patent
Hisano

(10) Patent No.: US 7,767,139 B2
(45) Date of Patent: Aug. 3, 2010

(54) ALRU SPUTTERING TARGET AND MANUFACTURING METHOD THEREOF

(75) Inventor: Akira Hisano, Ibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 555 days.

(21) Appl. No.: 11/733,016

(22) Filed: Apr. 9, 2007

(65) Prior Publication Data

US 2007/0175753 A1    Aug. 2, 2007

Related U.S. Application Data

(62) Division of application No. 10/479,687, filed as application No. PCT/JP03/05757 on May 8, 2003, now abandoned.

(30) Foreign Application Priority Data

Jun. 24, 2002    (JP) ............... 2002-182713

(51) Int. Cl.
   B22F 1/00    (2006.01)
   B22F 1/02    (2006.01)
(52) U.S. Cl. .......................... 419/42; 75/228
(58) Field of Classification Search ............ 419/42; 75/228
   See application file for complete search history.

(56) References Cited

U.S. PATENT DOCUMENTS

| 5,011,554 | A |   | 4/1991 | Fleischer |
|-----------|---|---|--------|-----------|
| 6,036,741 | A |   | 3/2000 | Shindo et al. |
| 6,159,625 | A | * | 12/2000 | Ueno ............ 428/832.1 |
| 6,284,013 | B1 |  | 9/2001 | Shindo et al. |
| 6,736,947 | B1 |  | 5/2004 | Watanabe et al. |
| 7,578,965 | B2 |  | 8/2009 | Shindo et al. |
| 2002/0014406 | A1 | | 2/2002 | Takashima |
| 2009/0114535 | A1 | | 5/2009 | Oda |
| 2009/0280025 | A1 | | 11/2009 | Kanou et al. |

OTHER PUBLICATIONS

Boniface et al. ("Investigation of the Aluminum-Ruthenium Phase Diagram above 25 at.% Ruthenium", Journal of Alloys and Compounds 234 (1996) 275-279).*
ESP@Cenet Database, English language Abstract of JP 10-317082, Dec. 2, 1998.
ESP@Cenet Database, English language Abstract of JP 11-293454, Oct. 26, 1999.

* cited by examiner

Primary Examiner—George Wyszomierski
Assistant Examiner—Weiping Zhu
(74) Attorney, Agent, or Firm—Howson & Howson LLP

(57) ABSTRACT

An AlRu sputtering target that is a sintered body composed of an AlRu intermetallic compound of 95 vol. % or more is provided. It is manufactured by a stable and low-cost method that provides it with an even texture, significantly reduces oxygen, prevents or suppresses the generation of particles, and improves the yield ratio of deposition goods.

19 Claims, 4 Drawing Sheets

Distribution image of Ru

SEM image  
25 μm

25 μm  
Distribution image of Ru

Distribution image of Al  25μm

Distribution image of oxygen  25μm

SEM image   25 μm

25 μm

Distribution image of Ru

Distribution image of Al  25 μm

Distribution image of oxygen  25 μm

ALRU SPUTTERING TARGET AND MANUFACTURING METHOD THEREOF

CROSS REFERENCE TO RELATED APPLICATIONS

This application is a divisional of U.S. application Ser. No. 10/479,687, which is the National Stage of International Application No. PCT/JP03/05757, filed May 8, 2003, which claims the benefit under 35 USC 119 of Japanese Application No. 2002-182713, filed Jun. 24, 2002.

BACKGROUND OF THE INVENTION

The present invention pertains to an AlRu sputtering target, and particularly to an AlRu sputtering target favorable in forming films for hard disks, as well as the manufacturing method thereof.

In recent years, in order to improve the data density of hard disks, numerous materials are being considered. Among such materials, a medium employing a multilayer film having AlRu as its constituent element (composed of an element having a sandwich structure with a magnetic layer) is known to significantly improve the recording density, and it is said that in the near future it will be possible to store 100 gigabits of data per square inch of the disk area.

In order to form a multilayer film with the sputtering method, most commonly, targets composed of a positive electrode and a negative electrode are made to face each other, and high voltage is applied between the substrate and target under an inert gas atmosphere in order to generate an electric field.

As a result of applying the high voltage described above, employed is the fundamental principle in which plasma is formed upon the atoms ionized at such time colliding with the inert gas, the positive ions within this plasma colliding with the target (negative electrode) surface and discharging the atoms structuring the target, whereby the film is formed by the discharged atoms adhering to the opposing substrate surface.

As this type of sputtering method, there are the high frequency sputtering (RF) method, magnetron sputtering method, DC (direct current) sputtering method, among others, and these methods are suitably used in accordance with the target material or conditions for forming the film.

In a conventional AlRu sputtering target, there is a particular problem in that the target material is not even, and that it contains a high content of oxygen.

When employing this kind of target, there are problems in that numerous particles will be generated upon forming the sputtering film, unevenness of the film will further generate a defective deposition product, and the yield ratio will decrease.

As the usage conditions of the AlRu sputtering target, Al-50 at % Ru is employed compositionally, but since the melting temperature of this composition is 2000° C. or higher, it is difficult to employ a melting-casting product as a target from the perspective of manufacturing costs.

Therefore, equimolar Al and Ru powders are used, and the sintered body target of Al-50 at % Ru obtained by mixing and sintering such powders is employed.

The SEM image, Ru distribution image, Al distribution image and O distribution image of a conventional Al-50 at % Ru sintered body target surface are shown in FIG. 5, FIG. 6, FIG. 7 and FIG. 8, respectively.

As shown in FIG. 5, the existence of numerous large grains can be acknowledged in the SEM image. In terms of chemical composition, Al, Ru, and Al—Ru alloy are dispersed unevenly.

Moreover, as shown in FIG. 6 and FIG. 7, it is evident that Ru and Al are significantly segregated. Further as shown in FIG. 8, oxygen is distributed in a large amount and in an uneven manner.

Accordingly, upon manufacturing an Al-50 at % Ru sintered body target, when simply employing equimolar Al and Ru powders, this will result in high oxygen content and uneven textures, thereby causing the generation of particles. In addition, with this kind of conventional manufacturing method, there is a problem in that the oxygen content cannot be reduced from the sintered body target.

SUMMARY OF THE INVENTION

An object of the present invention is to enable the stable and low-cost manufacture of an AlRu sputtering target having an even texture and capable of significantly reducing oxygen, and to prevent or suppress the generation of particles and improve the yield ratio of deposition goods.

As a result, provided is an AlRu sputtering target favorable in forming films for hard disks, and the manufacturing method thereof.

In order to achieve the foregoing object, as a result of intense study, the present inventors discovered that the oxygen content can be reduced, generation of particles can be prevented or suppressed, and the yield ratio of manufacture can be significantly improved by improving the manufacturing process and sintering process of powder.

Based on the foregoing discovery, the present invention provides an AlRu sputtering target characterized in that it is a sintered body composed of an AlRu intermetallic compound of 95 vol. % or more, characterized in that the oxygen content is 1500 wtppm or less, and/or characterized in that the relative density is 90% or more.

The present invention also provides a manufacturing method of an AlRu sputtering target, characterized in performing high frequency induction melting to raw materials Al and Ru, preparing powder having as its principal component an $Al_{13}Ru_4$ intermetallic compound by pulverizing the ingot obtained after melting or with the atomization method, and, after mixing Ru powder to this powder having as its principal component an $Al_{13}Ru_4$ intermetallic compound, performing sintering by hot pressing or hot isostatic pressing (HIP). Preferably, the oxygen content in the hot metal or ingot as a result of high frequency induction melting is 100 wtppm or less and sintering is performed at 1300 to 1500° C., at a sintering pressure of 150 Kgf/cm$^2$ or more, with powder having an average particle size of 50 to 100 μm; and in a vacuum. In addition, preferably oxygen content of the target is 1500 wtppm or less; the target is a sintered body composed of an AlRu intermetallic compound of 95 vol. % or more; and the relative density is 90% or more.

DETAILED DESCRIPTION OF THE INVENTION

The AlRu sputtering target of the present invention has a significant characteristic in that it is a sintered body composed of an AlRu intermetallic compound of 95 vol. % or more. Since an even texture of an AlRu intermetallic compound can be obtained, there is a significant effect in that an even film can be formed during sputtering deposition.

In terms of evenness, although it is preferable that the texture is formed only of an AlRu intermetallic compound, the existence of free Al, Ru or other intermetallic compounds less than 5 vol. % will not significantly affect the quality of deposition, and this degree of content is tolerable.

Moreover, the oxygen content of the AlRu sputtering target of the present invention is 1500 wtppm or less, thus having an oxygen content that is extremely reduced, and the target surface is therefore even. Further, it is also possible to obtain an AlRu sputtering target having a relative density of 90% or more.

Figure 1:
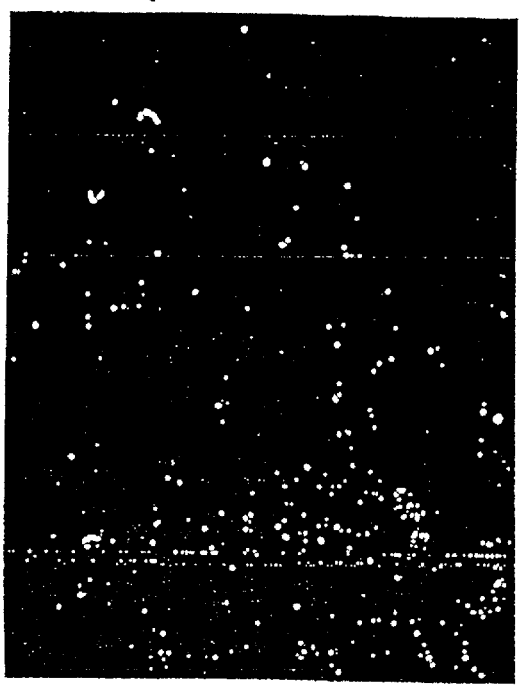
FIG. 1 is a diagram showing the SEM image of the AlRu intermetallic compound sintered body sputtering target of the present invention.

FIG. 1 shows an SEM image, which is an example of the AlRu sputtering target of the present invention. As shown in FIG. 1, an even surface is obtained.

Figure 2:
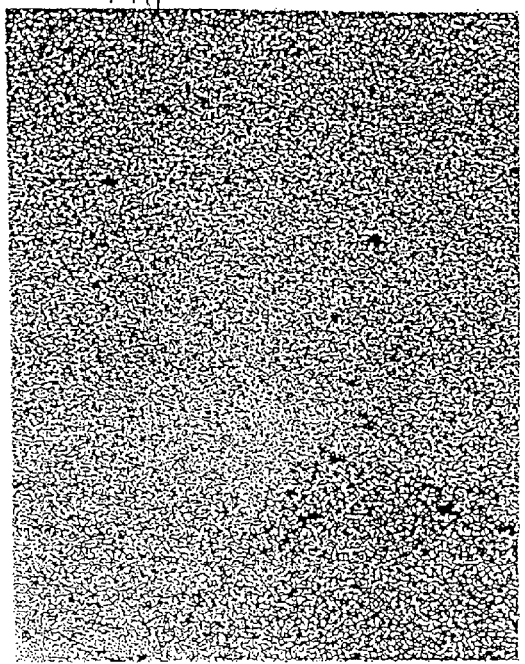
FIG. 2 is a diagram showing the Ru distribution image of the AlRu intermetallic compound sintered body sputtering target of the present invention.
Figure 3:
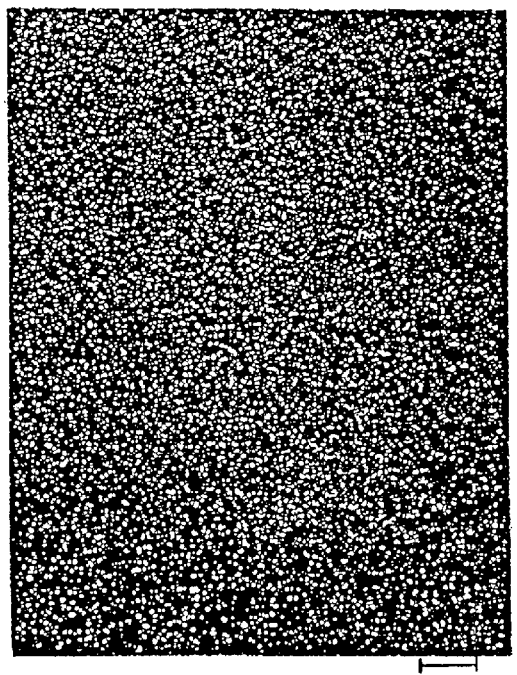
FIG. 3 is a diagram showing the Al distribution image of the AlRu intermetallic compound sintered body sputtering target of the present invention.
Figure 4:
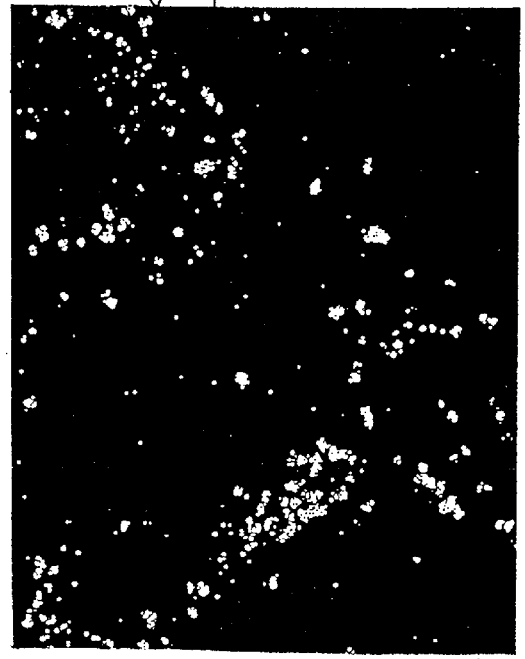
FIG. 4 is a diagram showing the O distribution image of the AlRu intermetallic compound sintered body sputtering target of the present invention.
Figure 5:
FIG. 5 is a diagram showing the SEM image of a conventional Al-50 at % Ru sintered body target.
Figure 6:
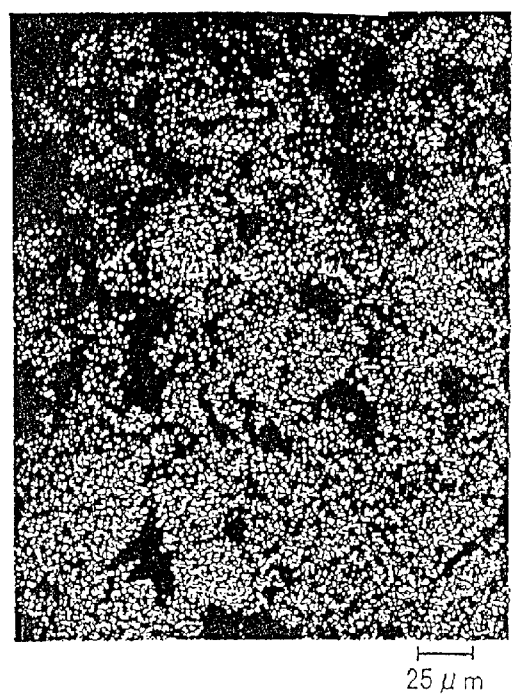
FIG. 6 is a diagram showing the Ru distribution image of a conventional Al-50 at % Ru sintered body target.
Figure 7:
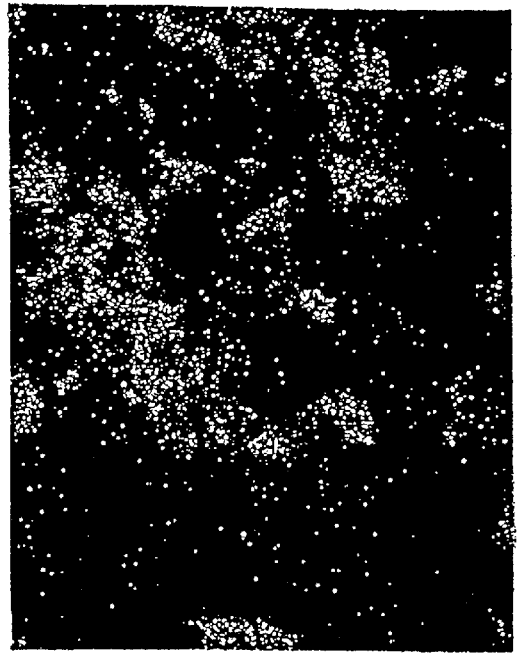
FIG. 7 is a diagram showing the Al distribution image of a conventional Al-50 at % Ru sintered body target.
Figure 8:
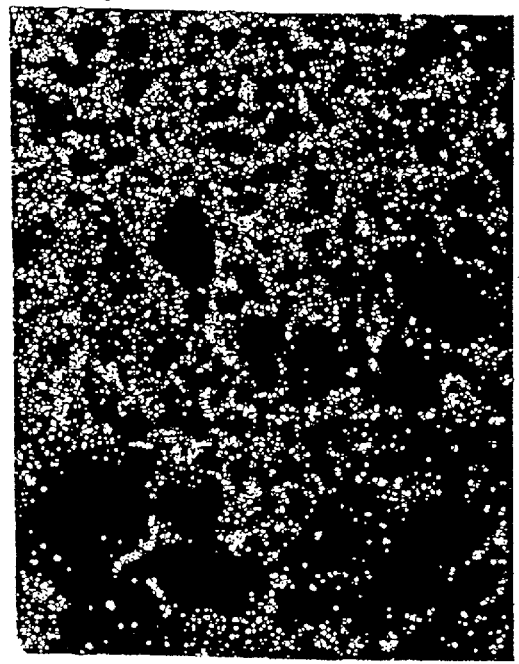
FIG. 8 is a diagram showing the O distribution image of a conventional Al-50 at % Ru sintered body target.

Moreover, FIG. 2 and FIG. 3 show the distribution images of Ru and Al, and it is evident that there is no significant segregation within the target and that it is superior in evenness. Further, FIG. 4 shows the distribution image of oxygen. It is clear from FIG. 4 that the oxygen content is extremely low and dispersed.

Upon manufacturing the target of the present invention, after the Al and Ru raw materials are cast or prepared such as the target composition of atomized powder becomes $Al_{13}Ru_4$ (the molar ratio of Al and Ru is approximately 3 to 4:1), this is melted at a high frequency. The oxygen content in the hot metal or ingot as a result of this high frequency induction melting can be made 100 wtppm or less.

An ingot is obtained after melting and casting the above, and this is pulverized to obtain powder having as its principal component an $Al_{13}Ru_4$ intermetallic compound. The melting of this component ratio can be carried out at a relatively low temperature of roughly 1400 to 1450° C., and a high temperature such as 2000° C. described above is not necessary. In addition, since the obtained $Al_{13}Ru_4$ intermetallic compound can easily be crushed, there is a characteristic in that the manufacture of powder is facilitated.

Instead of pulverizing the ingot after dissolution casting, it is also possible to obtain atomized powder having as its principal component an $Al_{13}Ru_4$ intermetallic compound with the gas atomization method. As a result of employing the gas atomization method, the oxygen content can be further reduced.

Next, Ru powder is mixed with this powder having as its principal component an $Al_{13}Ru_4$ intermetallic compound, and this is sintered by hot pressing or hot isostatic pressing (HIP). The amount of Ru powder to be mixed shall be the ultimately obtained amount of AlRu intermetallic compound. It is desirable that sintering is performed with powder having an average particle size of 50 to 100 μm. Further, in accordance with the sintering conditions, it would also be possible to employ powder other than the average particle size described above.

The sintering temperature is set between 1300 and 1500° C., and sintering is performed at a sintering pressure of 150 Kgf/cm$^2$ or more. In order to reduce oxygen even further, it is desirable that sintering is performed in a vacuum. As a result, it is possible to obtain a sputtering target composed of an AlRu intermetallic compound in which the oxygen content is 1500 wtppm or less, and having a relative density of 90% or more.

EXAMPLES AND COMPARATIVE EXAMPLES

Next, the Examples and Comparative Examples of the present invention are explained. The Examples are mere exemplifications of the present invention, and shall not limit the present invention in any way. In other words, modifications and other modes based on the technical spirit of the present invention shall all be included herein.

Example 1

The Al and Ru raw materials were prepared to be a 20 Kg raw material where Al 3.25 mol:Ru 1 mol, respectively, and this was melted at a high frequency (in a vacuum). The melting temperature was 1650° C. As a result of this high frequency vacuum melting, it was possible to suppress the oxygen content in the hot metal to 50 wtppm.

An ingot was obtained after dissolving and casting the above, and this was pulverized to obtain powder having as its principal component an $Al_{13}Ru_4$ intermetallic compound. Moreover, the obtained $Al_{13}Ru_4$ intermetallic compound was brittle and could be pulverized easily, and powder having an average particle size of 75 μm was obtained as a result thereof.

Ru powder having the same particle size as the powder having as its principal component $Al_{13}Ru_4$ intermetallic compound was mixed thereto, and this mixed powder was filled in a graphite dice for sintering. The amount of Ru powder to be mixed was made to be the ultimately obtained amount of AlRu intermetallic compound.

Next, sintering was performed with hot pressing under an Ar atmosphere. A sintered body block was obtained by sintering at a sintering temperature of 1350° C. and a sintering pressure of 200 Kgf/cm$^2$. A block of this was further cut out and processed into a target upon performing surface grinding or the like.

As a result, it was possible to obtain a sputtering target composed of an AlRu intermetallic compound in which the oxygen content is 1450 wtppm, and having a relative density of 85%. The ratio of the AlRu intermetallic compound in the target was 99.5%, and the target had a texture equivalent to those shown in FIG. 1 to FIG. 4.

Example 2

The Al and Ru raw materials were prepared to be a 20 Kg raw material where Al 3.25 mol:Ru 1 mol, respectively, and this was melted at a high frequency (in a vacuum). The melting temperature was 1650° C. As a result of this high frequency vacuum melting, it was possible to suppress the oxygen content in the hot metal to 50 wtppm.

An ingot was obtained after dissolving and casting the above, and this was pulverized to obtain powder having as its principal component an $Al_{13}Ru_4$ intermetallic compound. Moreover, the obtained $Al_{13}Ru_4$ intermetallic compound was brittle and could be pulverized easily, and powder having an average particle size of 75 μm was obtained as a result thereof.

Ru powder having the same particle size as the powder having as its principal component $Al_{13}Ru_4$ intermetallic compound was mixed thereto, and this mixed powder was filled in a graphite dice for sintering. The amount of Ru powder to be mixed was made to be the ultimately obtained amount of AlRu intermetallic compound.

Next, sintering was performed with hot pressing in a vacuum. A sintered body block was obtained by sintering at a sintering temperature of 1450° C. and a sintering pressure of 200 Kgf/cm². A block of this was further cut out and processed into a target upon performing surface grinding or the like.

As a result, it was possible to obtain a sputtering target composed of an AlRu intermetallic compound in which the oxygen content is 1350 wtppm, and having a relative density of 91%. The ratio of the AlRu intermetallic compound in the target was 99.7 vol. %, and the target had a texture equivalent to those shown in FIG. 1 to FIG. 4.

Upon performing sputtering with the sintered body target composed of the AlRu intermetallic compound obtained above, there were hardly any generation of particles, and it was possible to form an even film for a long period of time.

Example 3

The Al and Ru raw materials were prepared to be a 20 Kg raw material where Al 3.25 mol:Ru 1 mol, respectively, and this was melted at a high frequency (in a vacuum). The melting temperature was 1650° C. As a result of this high frequency vacuum melting, it was possible to suppress the oxygen content in the hot metal to 50 wtppm.

An ingot was obtained after dissolving and casting the above, and this was pulverized to obtain powder having as its principal component an $Al_{13}Ru_4$ intermetallic compound. Moreover, the obtained $Al_{13}Ru_4$ intermetallic compound was brittle and could be pulverized easily, and powder having an average particle size of 75 μm was obtained as a result thereof.

Ru powder having the same particle size as the powder having as its principal component $Al_{13}Ru_4$ intermetallic compound was mixed thereto, and this mixed powder was filled in a graphite dice for sintering. The amount of Ru powder to be mixed was made to be the ultimately obtained amount of AlRu intermetallic compound.

Next, sintering was performed with hot pressing in a vacuum. A sintered body block was obtained by sintering at a sintering temperature of 1550° C. and a sintering pressure of 200 Kgf/cm². A block of this was further cut out and processed into a target upon performing surface grinding or the like.

As a result, it was possible to obtain a sputtering target composed of an AlRu intermetallic compound in which the oxygen content is 1070 wtppm, and having a relative density of 95%. The ratio of the AlRu intermetallic compound in the target was 99.9 vol. %, and the target had a texture equivalent to those shown in FIG. 1 to FIG. 4.

Upon performing sputtering with the sintered body target composed of the AlRu intermetallic compound obtained above, there were hardly any generation of particles, and it was possible to form an even film for a long period of time.

Comparative Example 1

The Al and Ru raw material powders having an average particle size of 75 μm were prepared to be a mixed powder where Al 1 mol:Ru 1 mol, respectively, and this was filled in a graphite dice for sintering.

Next, sintering was performed with hot pressing under an Ar atmosphere. A sintered body block was obtained by sintering at a sintering temperature of 600° C. and a sintering pressure of 200 Kgf/cm². A block of this was further cut out and processed into a target upon performing surface grinding or the like.

As a result, it was possible to obtain an AlRu sputtering target in which the oxygen content is 2500 wtppm, and having a relative density of 70%. Al, Ru, and AlRu intermetallic compound were mixed in the target, and the ratio of the AlRu intermetallic compound in the target was 20 vol. %. The target had a texture equivalent to those shown in FIG. 5 to FIG. 8.

Upon performing sputtering with the sintered body target obtained above, the generation of particles increased abnormally, it was not possible to form an even film, and defective goods were produced as a result thereof.

As clear from the above, the AlRu sputtering target falling within the scope of the present invention disclosed in the Examples is capable of obtaining an even texture of AlRu intermetallic compound. Thus, in addition to significantly reducing the number of particles during sputtering deposition, an even film can be formed.

Moreover, the oxygen content of the AlRu intermetallic compound sputtering target of the present invention is 1500 wtppm or less, thus having an oxygen content that is extremely reduced, and the target surface (erosion face) is therefore even. Further, it is also possible to obtain an AlRu sputtering target having a relative density of 90% or more. In addition, there is no significant segregation within the target and the evenness is superior.

Upon manufacturing the target of the present invention, the oxygen content in the hot metal or ingot can be made 100 wtppm or less by performing high frequency induction melting to the Al and Ru raw materials. An ingot is obtained after melting and casting the above, and this is pulverized to obtain powder having as its principal component an $Al_{13}Ru_4$ intermetallic compound. The melting of this component ratio can be carried out at a relatively low temperature of roughly 1400 to 1450° C., and a characteristic is yielded in that the manufacturing cost can be reduced. In addition, there is an advantage in that cost can be reduced for the pulverizing process since the obtained $Al_{13}Ru_4$ intermetallic compound can easily be crushed, and pulverization is facilitated thereby.

Instead of pulverizing the ingot after dissolution casting, it is also possible to obtain powder having as its principal component an $Al_{13}Ru_4$ intermetallic compound with the gas atomization method. As a result of employing the gas atomization method, a characteristic is yielded in that the oxygen content can be further reduced.

The sintering temperature is set between 1300 and 1500° C., and sintering is performed at a sintering pressure of 150 Kgf/cm² or more. And, by performing sintering in a vacuum, the oxygen content can be reduced even more.

The invention claimed is:

1. A method of manufacturing an AlRu sputtering target, comprising the steps of:
    performing high frequency induction melting with raw materials Al and Ru;
    forming an ingot by casting a melt obtained by said high frequency induction melting;
    preparing a first powder from said ingot, said first powder having as a principal component an $Al_{13}Ru_4$ intermetallic compound, said step of preparing said first powder from said ingot is accomplished by pulverizing said ingot or by employing a gas atomization method on said ingot;

mixing Ru powder and said first powder to produce a mixture; and sintering said mixture by hot pressing or hot isostatic pressing (HIP).

2. A method according to claim 1, wherein said steps of performing high frequency induction melting and forming an ingot produce an ingot having an oxygen content of 100 wtppm or less.

3. A method according to claim 2, wherein said step of sintering is performed at 1300 to 1500° C.

4. A method according to claim 3, wherein said step of sintering is performed at a sintering pressure of 150 Kgf/cm$^2$ or more.

5. A method according to claim 4, wherein said mixture to which said step of sintering is performed is made of particles having an average particle size of 50 to 100 μm.

6. A method according to claim 5, wherein said step of sintering is performed in a vacuum.

7. A method according to claim 6, wherein said step of sintering produces a sintered body having an oxygen content of 1500 wtppm or less.

8. A method according to claim 7, wherein said step of sintering produces a sintered body composed of 95 vol. % or more of an AlRu intermetallic compound.

9. A method according to claim 8, wherein said step of sintering produces a sintered body having a relative density of 90% or more.

10. A method according to claim 1, wherein said step of sintering is performed at 1300 to 1500° C.

11. A method according to claim 1, wherein said step of sintering is performed at a sintering pressure of 150 Kgf/cm$^2$ or more.

12. A method according to claim 1, wherein said mixture to which said step of sintering is performed is made of particles having an average particle size of 50 to 100 μm.

13. A method according to claim 1, wherein said step of sintering is performed in a vacuum.

14. A method according to claim 1, wherein said step of sintering produces a sintered body having an oxygen content of 1500 wtppm or less.

15. A method according to claim 1, wherein said step of sintering produces a sintered body composed of 95 vol. % or more of an AlRu intermetallic compound.

16. A method according to claim 1, wherein said step of sintering produces a sintered body having a relative density of 90% or more.

17. A method of manufacturing an AlRu sputtering target, comprising the steps of:

high frequency melting raw materials in a vacuum to form a melt, the raw materials consisting of Al and Ru at a molar ratio of Al and Ru of 3 to 4:1;

casting an ingot from the melt such that the ingot has an oxygen content of 100 wtppm or less;

pulverizing or atomizing the ingot to form a first powder having an Al$_{13}$Ru$_4$ intermetallic compound as a principal component;

mixing Ru powder and the first powder to produce a mixture, the Ru powder being in an amount necessary to obtain 95 vol. % or more of AlRu intermetallic compound; and sintering the mixture in a vacuum by hot pressing or hot isostatic pressing (HIP) to produce a sintered body composed of 95 vol. % or more of AlRu intermetallic compound having an oxygen content of 1500 wtppm or less and a relative density of 90% or more.

18. A method according to claim 17, wherein said step of sintering is performed at 1300 to 1500° C. and at a sintering pressure of 150 Kgf/cm$^2$ or more, and wherein the mixture to which said step of sintering is performed is made of particles having an average particle size of 50 to 100 μm.

19. A method according to claim 17, wherein said pulverizing or atomizing step is a gas atomization process step that forms atomized powder.

* * * * *